United States Patent
Kneer et al.

(10) Patent No.: US 11,944,012 B2
(45) Date of Patent: Mar. 26, 2024

(54) METHOD FOR TRANSMITTING DATA FROM AN ACTUATOR TO A CONTROL UNIT, CORRESPONDING ACTUATOR, AND CORRESPONDING CONTROL UNIT

(71) Applicant: Robert Bosch GmbH, Stuttgart (DE)

(72) Inventors: Andreas Kneer, Koengen (DE); Andreas Hempel, Ludwigsburg (DE); Charlotte Summerer, Stuttgart (DE); Dieter Elshuber, Attnang-Puchheim (AT); Dieter Schuler, Stuttgart (DE); Markus Ditlevsen, Stuttgart (DE); Yannick Chauvet, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 346 days.

(21) Appl. No.: 17/448,479

(22) Filed: Sep. 22, 2021

(65) Prior Publication Data

US 2022/0181539 A1 Jun. 9, 2022

(30) Foreign Application Priority Data

Dec. 9, 2020 (DE) .......................... 102020215549.6

(51) Int. Cl.
*H10N 30/80* (2023.01)
*H10N 30/20* (2023.01)

(52) U.S. Cl.
CPC ........... *H10N 30/802* (2023.02); *H10N 30/20* (2023.02)

(58) Field of Classification Search
CPC .............................. H10N 30/802; H10N 30/20
See application file for complete search history.

(56) References Cited

U.S. PATENT DOCUMENTS

| | | | |
|---|---|---|---|
| 8,915,158 B2* | 12/2014 | Stalford | B81B 3/0062 74/25 |
| 2007/0273245 A1* | 11/2007 | Hardy | F02D 41/2096 310/316.03 |
| 2009/0090333 A1* | 4/2009 | Spadafora | F02D 41/2096 123/494 |
| 2009/0184176 A1* | 7/2009 | Cooke | F02M 51/0603 239/102.2 |
| 2015/0061456 A1* | 3/2015 | Stalford | F03G 7/065 310/306 |
| 2017/0040524 A1* | 2/2017 | Hasan | G01L 1/26 |

* cited by examiner

*Primary Examiner* — Zoheb S Imtiaz
(74) *Attorney, Agent, or Firm* — NORTON ROSE FULBRIGHT US LLP; Gerard A. Messina

(57) ABSTRACT

A method for transmitting data from an actuator to a control unit controlling the actuator. The control unit controls a piezoelectric element contained in the actuator. In order to transmit the data, in the actuator, a load being or not being connected in parallel with the piezoelectric element.

8 Claims, 2 Drawing Sheets

METHOD FOR TRANSMITTING DATA FROM AN ACTUATOR TO A CONTROL UNIT, CORRESPONDING ACTUATOR, AND CORRESPONDING CONTROL UNIT

CROSS REFERENCE

The present application claims the benefit under 35 U.S.C. § 119 of German Patent Application No. DE 102020215549.6 filed on Dec. 9, 2020, which is expressly incorporated herein by reference in its entirety.

FIELD

The present invention relates to a method for transmitting data from an actuator to a control unit, as well as a corresponding actuator and a corresponding control unit.

BACKGROUND INFORMATION

Actuators whose features are ascertained at the end of manufacturing and, with the aid of a dot matrix, are applied to the outside of the actuator in the form of corresponding data, are conventional. Upon initial operation, the corresponding data are then read out from the dot matrix by a mechanic and transmitted to a control unit.

SUMMARY

A method of the present invention and/or the actuator or control unit of the present invention may have an advantage that automated transmission of data from an actuator to the control unit is carried out by electrical signals. Therefore, it is no longer necessary to read out a dot matrix and transmit it into the control unit. In this manner, in particular, manual working steps may be saved in the integration of actuators and control units.

Further advantages and improvements of the present invention are disclosed herein.

In accordance with an example embodiment of the present invention, the transmission of data is requested by the control unit in a particularly simple manner, using a second voltage difference, which differs clearly from a first voltage difference for controlling the actuator. In this context, the second voltage difference is selected in such a manner, that operation of the actuator is prevented. Thus, unintentional operation of the actuator is reliably prevented. A parallel connection of the load is detected in a particularly simple manner, by measuring a current in the control unit. The voltage levels are distinguished in a particularly simple manner, using the polarity. The data transmitted by the actuator are used by the control unit, in particular, to control the actuator. In this manner, variations in the manufacturing of the actuator may be taken into account during the driving of the actuator. The corresponding data are ascertained in a particularly simple manner during the manufacturing of the actuator.

BRIEF DESCRIPTION OF THE DRAWINGS

Exemplary embodiments of the present invention are represented in the figures and explained in more detail in the following description.

DETAILED DESCRIPTION OF EXAMPLE EMBODIMENTS

Figure 1:
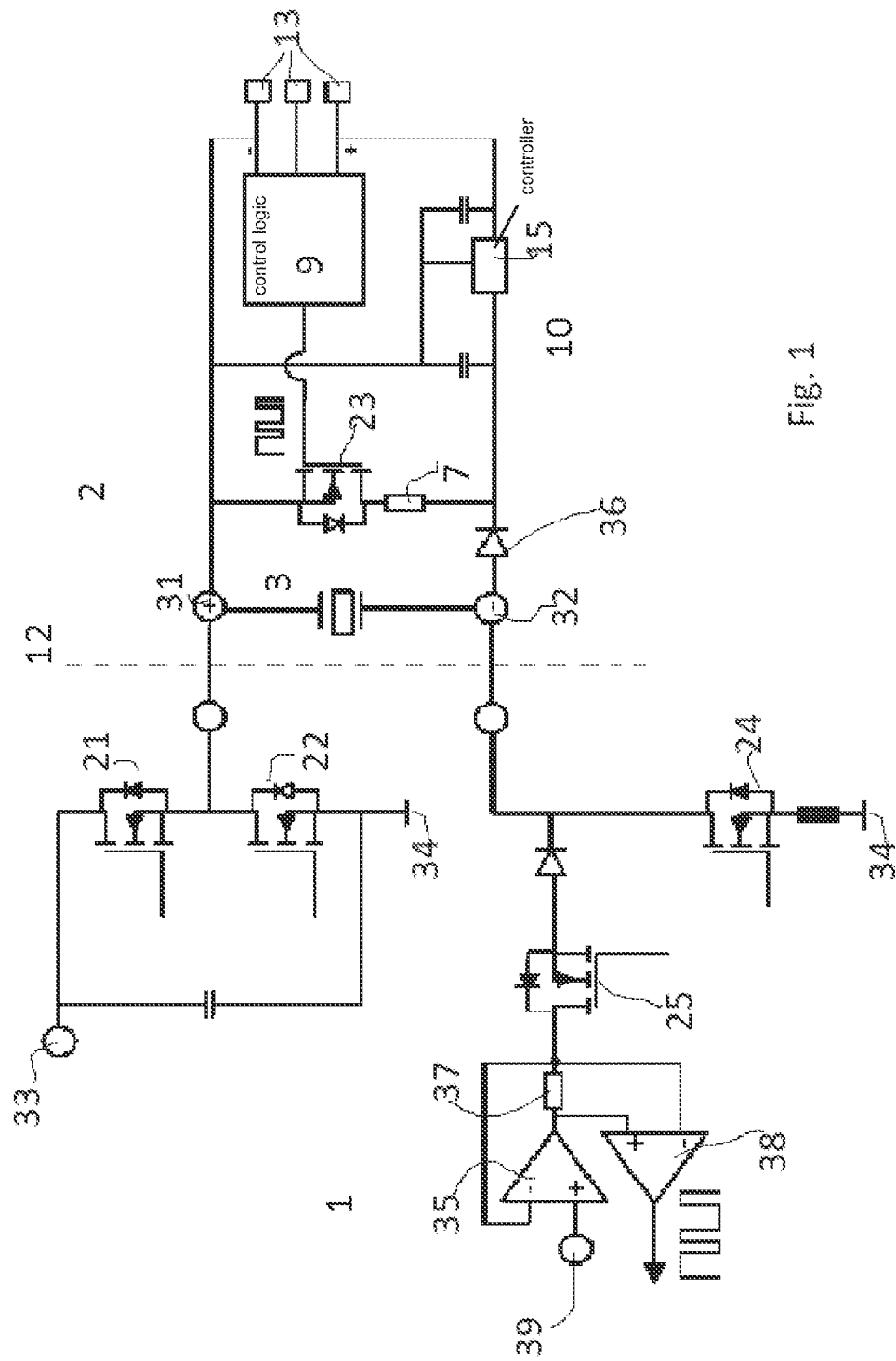
FIG. 1 shows a schematic circuit diagram of the control unit and the actuator in accordance with an example embodiment of the present invention.

A control unit 1 and an actuator 2 are represented schematically in FIG. 1; in each instance, only the relevant electronic components of control unit 1 and actuator 2 being shown. In the representation of FIG. 1, the components of control unit 1 are shown to the left of dashed separating line 12, and the components of actuator 2 are shown to the right of dashed separating line 12. Actuator 2 is an actuator, which includes a piezoelectric element 3. Such a piezoelectric element 3 is a mechanical actuator, which experiences a change in length on the basis of an applied voltage. This change in length may be used directly as a mechanical actuator. Such actuators are used, for example, as valves for the dosed injection of liquids, such as fuel into a motor.

Piezoelectric element 3 is operated by control unit 1, by appropriately controlling the MOSFET transistors 21, 22, and 24 taking the form of switches. Alternatively, switches 21, 22, 24 may also be formed by other transistors, such as IGBTs. A first terminal 31 of piezoelectric element 3 is connected by switch 21 to a high-voltage terminal 33 of control unit 1. A voltage difference of, for example, 250 V with respect to a grounded connection 34 is applied to high-voltage terminal 33 of control unit 1. First terminal 31 of piezoelectric element 3 is connected to a grounded connection 34 of control unit 1 by switch 22. Therefore, by alternately operating switches 21 and 22, terminal 31 of actuator 2, that is, of piezoelectric element 3, may be connected selectively to a control voltage of 250 V or ground, through which piezoelectric element 3 contracts and expands again. A second terminal 32 of piezoelectric element 3 is connected to a grounded connection 34 of control unit 1 by a switch 24. During the activation of actuator 2, that is, of piezoelectric element 3, switch 24 is rendered conductive, and therefore, second terminal 32 is connected to grounded connection 34. Thus, using a suitable program in control unit 1, actuator 2 may be controlled by operating the transistors or switches 21, 22, and 24.

Consequently, piezoelectric element 3 may be controlled, and therefore, actuator 2 may be operated, as a function of a program stored in control unit 1. Variations of the characteristics of actuator 2 caused by manufacturing are problematic for such control of actuator 2 by a control unit 1. In order to compensate for such variations, it is desirable for the control of actuator 2, that information regarding the variation of the characteristics of actuator 2 be known in control unit 1. In the case of manufacturing actuator 2, the characteristics of actuator 2 may be ascertained at the end of manufacturing and used for controlling piezoelectric element 3. To that end, in FIG. 1, actuator 2 includes control logic 9, which contains a memory internally, in which such information regarding the variations of characteristics of the actuator are stored. In addition, actuator 2 has further devices, which allow information stored in control logic 9 to be transmitted back to control unit 1.

A load 7 connected in series with a switch 23 taking the form of a transistor is positioned in parallel with piezoelectric element 3. Therefore, by rendering switch 23 conductive, load 7 may be connected in parallel with piezoelectric element 3. Switch 23 takes the form of a transistor, such as a MOSFET or IGBT, and is controlled by control logic 9 via a control line. Switch 23 may be brought into a conductive or nonconductive state, using a corresponding signal of control logic 9.

In addition, actuator 2 also includes a voltage supply 10, which has, in addition to a controller 15, some capacitors for stabilizing the controlled voltage. Voltage supply 10 ensures a sufficient supply of voltage for control logic 9, if a voltage signal is applied sufficiently often to actuator 2 by control unit 1. In this context, voltage supply 10 ensures a supply of voltage for control logic 9, even if no voltage signal is applied to actuator 2 by control unit 1 for a short time.

Furthermore, control logic 9 also has 3 external terminals 13, which are used for external programming and/or storage of data. To that end, information regarding characteristics of actuator 2 ascertained in the manufacture of actuator 2 is stored in control logic 9 via terminals 13. A supply voltage is connected to one of terminals 13, another terminal 13 is connected to ground, and the corresponding data signals are applied to the further terminal 13.

Control unit 1 may induce the transmission of data from actuator 2, that is, from control logic 9 of actuator 2, to control unit 1, by applying a second voltage difference to actuator 2. This second voltage difference preferably has an algebraic sign opposite to that of the first voltage difference. To that end, control unit 1 initially opens switch 24, so that terminal 32 of actuator 2 is no longer connected to ground. In addition, switch 21 is opened, so that terminal 31 of actuator 2 is no longer connected to the terminal 33, to which a high voltage of 250 V is applied. Switch 22 is rendered conductive, so that terminal 31 is continually connected to ground. In addition, switch 25 is rendered conductive. A supply voltage of, for example, 6 V, which, together with operational amplifier 35, constitutes a constant voltage source, is applied to terminal 39. To that end, an input of operational amplifier 35 is connected to output. Consequently, terminal 32 of actuator 2 is supplied with a constant voltage by closed switch 25. This voltage at terminal 32 is designed to be so small, that no significant positioning movements of actuator 2 are able to be produced. Using diode 36, voltage supply 10 is activated, and in this manner, control logic 9 is put into operation. The control logic 9 activated in this manner then generates appropriate control pulses to operate switch 23, by which resistor 7 is connected in parallel with piezoelectric element 3. As a result of this parallel connection, the flow of current through the constant voltage source, which is formed by operational amplifier 35, is loaded by different currents as a function of whether or not resistor 7 is connected in parallel. This current may be verified, using a voltage drop at resistor 37, which is situated between the output of operational amplifier 35 and switch 25, in that the voltage drop before and after resistor 37 is detected by operational amplifier 38. To that end, the two inputs of operational amplifier 28 before and after resistor 37 are connected. Accordingly, a signal, which corresponds to the corresponding circuit states of load 7 and/or to the switching states of switch 23, is outputted at the output of operational amplifier 38. The output signal of operational amplifier 28 may then be processed in suitable software of control unit 1, in order to process the values stored in control logic 9. Thus, a corresponding value, which was programmed into control logic 9 during the manufacture of the actuator, may be transmitted to control unit 1.

The method of the present invention may be used, in particular, if certain characteristics of actuator 2 differ from each other due to variations in the manufacturing. For example, actuator 2 may be designed as a valve for injecting a liquid, and the volume of liquid injected by the valve may vary in response to the same applied control signals due to manufacturing variations. Such a valve may be used, for example, to inject fuel into an internal combustion engine. Such a variation of the valve could then be determined at the end of manufacturing, using test injections and appropriate measurements, and corresponding parameters, which describe this, are then stored in logic circuit 9. To this end, logic circuit 9 includes external terminals 13, via which initial operation of logic chip 9 may take place, and thus, corresponding measurement data may be programmed in. If actuator 2 is then operated together with a control unit 1, these data stored in control logic 9 would be transmitted either in the event of initial operation or also from time to time during continuous operation. In this manner, negative effects due to manufacturing variations during the manufacture of the actuators may be prevented.

Figure 2:
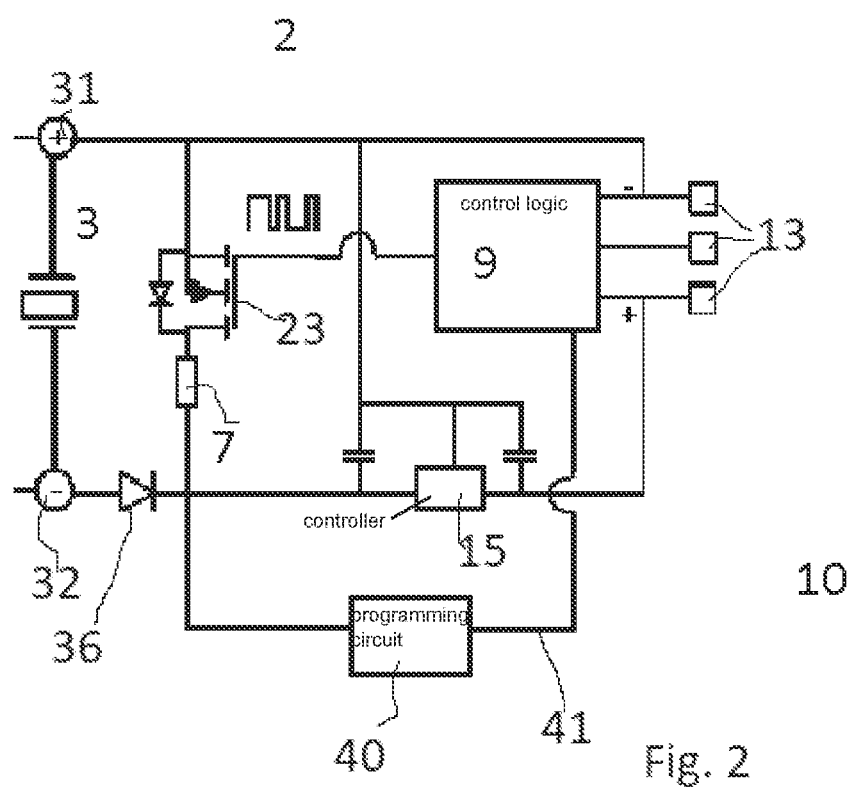
FIG. 2 shows an alternative example of an actuator, in accordance with an example embodiment of the present invention.

Another alternative specific embodiment of the actuator 2 according to the present invention is shown in FIG. 2. Reference numerals 31, 32, 36, 3, 23, 7, 10, 15, 9 and 13 denote again the same objects having the same functions as were described with regard to FIG. 1. In contrast to FIG. 1, however, terminals 13 in actuator 2 may no longer be contacted from the outside or are given other functions in the finished state. Thus, the storing of data in control logic 9 may not take place via terminals 13. In the example of FIG. 2, storage in control logic 9 is accomplished by applying a different voltage to terminal 32 that is, in particular, higher than what may occur in normal operation between control unit 1 and actuator 2. If, for example, a voltage of 6 Volts is applied by control unit 1 to terminal 32, then a voltage of 8 Volts may be applied for the purpose of storing data in control logic 9. An increased voltage is then applied to the cathode of diode 36, as well, and is detected by the programming circuit 40 connected to it. When the increased voltage is applied, then, by appropriately clocking the voltage signal between terminals 32 and 31, a corresponding data word may be transmitted to programming circuit 40 and stored in control logic 9 via line 41.

What is claimed is:

1. A method for transmitting data from an actuator to a control unit configured to control the actuator, the control unit configured to control a piezoelectric element contained in the actuator, the method comprising:
   for transmitting the data, in the actuator, connecting or not connecting, a load in parallel with the piezoelectric element;
   wherein the control unit applies a first predetermined voltage difference to the piezoelectric element for controlling the piezoelectric element and a second predetermined voltage difference to the piezoelectric element for transmitting the data; and
   wherein the second voltage difference is not large enough to drive the actuator.

2. The method as recited in claim 1, wherein the second voltage difference applied by the control unit is influenced by the parallel connection of the load.

3. The method as recited in claim 2, wherein a current needed for applying the second voltage difference is determined, using the parallelly connected load and without the parallelly connected load.

4. The method as recited in claim 1, wherein the first and the second voltage differences have opposite algebraic signs.

5. The method as recited in claim 1, wherein the actuator includes control logic, information regarding characteristics of the actuator is stored in the control logic, the information regarding the characteristics is transmitted with the data to the control unit, and the control unit uses the transmitted data to control the actuator.

6. The method as recited in claim 5, wherein the information regarding the characteristics of the actuator is information which was ascertained during manufacture of the actuator by measuring the characteristics of the actuator, is stored in the control logic.

7. An actuator comprising a piezoelectric element, and a device to connect or not connect a load in parallel with the piezoelectric element to transmit the data;

wherein the piezoelectric element is controllable by applying a first predetermined voltage different to the actuator, and when a second predetermined voltage difference is applied to the actuator, the actuator transmits the data by connecting or not connecting the load in parallel with the piezoelectric element, wherein the second voltage difference is not large enough to drive the actuator.

8. A control unit for controlling an actuator, the actuator including a piezoelectric element, and a device to connect or not connect a load in parallel with the piezoelectric element to transmit the data, the control unit including devices configured to control the piezoelectric element, and further devices configured to detect the connection or non-connection of the load in parallel with the piezoelectric element, and to receive the data sent by the actuator;

wherein the control unit is configured to apply a first predetermined voltage difference to the piezoelectric element for controlling the piezoelectric element and a second predetermined voltage difference to the piezoelectric element for transmitting the data; and wherein the second voltage difference is not large enough to drive the actuator.

* * * * *